(12) United States Patent
Salles et al.

(10) Patent No.: US 10,114,055 B2
(45) Date of Patent: Oct. 30, 2018

(54) ELECTROSTATIC DISCHARGE TESTER

(71) Applicant: NXP USA, Inc., Austin, TX (US)

(72) Inventors: Alain Salles, Ramonville Saint Agne (FR); Jean Dalmon, Lagarde (FR); Roger Stivanin, Labarthe sur Leze (FR)

(73) Assignee: NXP USA, Inc., Austin, TX (US)

( * ) Notice: Subject to any disclaimer, the term of this patent is extended or adjusted under 35 U.S.C. 154(b) by 156 days.

(21) Appl. No.: 15/365,439

(22) Filed: Nov. 30, 2016

(65) Prior Publication Data

US 2017/0160326 A1 Jun. 8, 2017

(30) Foreign Application Priority Data

Dec. 7, 2015 (WO) .................. PCT/IB2015/002502

(51) Int. Cl.
| | | |
|---|---|---|
| *G01R 31/20* | (2006.01) | |
| *G01R 31/00* | (2006.01) | |
| *G01R 1/04* | (2006.01) | |
| *G01R 31/26* | (2014.01) | |
| *G01R 31/28* | (2006.01) | |

(52) U.S. Cl.
CPC ......... *G01R 31/002* (2013.01); *G01R 1/0408* (2013.01); *G01R 1/0416* (2013.01); *G01R 31/2601* (2013.01); *G01R 31/2891* (2013.01); *G01R 31/2834* (2013.01); *G01R 31/2887* (2013.01)

(58) Field of Classification Search
CPC ............. G01R 1/0408; G01R 31/2601; G01R 31/2891; G01R 31/2834; G01R 31/2887
USPC ......... 324/71, 378, 403, 415, 425, 500, 537, 324/750.16, 750.25
See application file for complete search history.

(56) References Cited

U.S. PATENT DOCUMENTS

| | | | | |
|---|---|---|---|---|
| 2009/0066354 | A1* | 3/2009 | Gaertner | G01R 31/002 324/754.08 |
| 2015/0004842 | A1* | 1/2015 | Liu | H01R 13/7033 439/620.21 |
| 2015/0333377 | A1* | 11/2015 | Davila | H01M 10/425 429/50 |

OTHER PUBLICATIONS

Afnor: "CEI 61000-4-2:2008", International Standard, Electromagnetic compatibility (EMC)—Part 4-2: Testing and measurement techniques—Electrostatic discharge immunity test, Dec. 2008, Edition 2.0, pp. 1-136.

(Continued)

*Primary Examiner* — Jermele M Hollington
*Assistant Examiner* — Raul Rios Russo

(57) ABSTRACT

Apparatus for testing a device by delivering an electrostatic discharge signal to one or more device terminals, comprising a first part configured for mechanically mounting the device and comprising one or more first part connectors for electrically coupling to the one or more device terminals and thus providing electrical access to the one or more device terminals, a second part comprising one or more second part connectors configured for electrically coupling the one or more first part connectors to the one or more second part connectors for testing the device via the second part connectors, and a guide arranged for mechanically moving the first part relative to the second part. The guide is configured to physically disconnect the one or more first part connectors from the one or more second part connectors while the electrostatic discharge signal is delivered to the one or more device terminals.

20 Claims, 3 Drawing Sheets

(56) References Cited

OTHER PUBLICATIONS

ISO: "ISO 11452-1", International Standard, Road vehicles—Component test methods for electrical disturbances from narrowband radiated electromagnetic energy—Part 1: General principles and terminology, Third Edition Feb. 1, 2005, Reference No. ISO 11452-1:2005(E), pp. 1-26.

ISO: "ISO 10605", International Standard, Road vehicles—Test methods for electrical disturbances from electrostatic discharge, Second Edition Jul. 15, 2008, Reference No. ISO 10605:2008(E), pp. 1-58.

* cited by examiner

ELECTROSTATIC DISCHARGE TESTER

FIELD OF THE INVENTION

This invention relates to an apparatus for testing a device by delivering an electrostatic discharge signal to one or more device terminals of the device and to a method of testing a device by delivering an electrostatic discharge signal to one or more device terminals.

BACKGROUND OF THE INVENTION

Testers for evaluating robustness of electronic devices against electrostatic discharge signals are of great importance in order to be able to establish which operating and environmental conditions can withstand the electronic device.

Electrostatic discharge (ESD) signals can occur while handling the device in industrial or commercial environments. ESD failures can be difficult to detect because ESD events are unpredictable and difficult to reproduce in laboratory tests. A good ESD strategy at device level and testers capable of reliable ESD test results are thus of utmost importance for commercializing electronic device in high volume with very limited ESD failure rates.

An ESD tester typically measures several electrical characteristics of each externally accessible terminal of the device before and after delivering the ESD signal to the terminal.

However, in order to measure these electrical characteristic of each externally accessible terminal of the device, a measurement device (for example an I-V tracer or any other measurement device) is typically electrically connected to each device terminal via a respective measurement terminal of the measurement device. Electrical switches may be used which electrically decouple the device terminals from the measurement terminals when the ESD signal is delivered to a terminal of the device and electrically couple the device terminals to the measurement terminals when the device terminal is tested after the ESD signal has been delivered. However, electrical isolation provided by the electrical switches may be not sufficient to electrically isolate the measurement device from the ESD signal, thereby a risk exists to damage the measurement device during delivering the ESD signal. Further, electrical switches have parasitic capacitances which charge while delivering the ESD signal, i.e. when the electrical switches are switched off, and discharge while testing the device terminal, i.e. when the electrical switches are switched on, thereby changing the level of ESD stress delivered to the device. As a consequence the resulting ESD test from known ESD testers is not reliable.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. In the Figures, elements, which correspond to elements already described, may have the same reference numerals.

DETAILED DESCRIPTION OF THE PREFERRED EMBODIMENTS

An inventive apparatus for testing a device with an electrostatic discharge (ESD) signal is described. The apparatus includes a first part, a second part and a guide for mechanically moving the first part relative to the second part. The first part includes first part connectors for electrically coupling to the one or more device terminals, thus providing electrical access to the one or more device terminals. The first part is configured for mounting the device. The second part includes one or more second part connectors. The second part is configured for electrically coupling the one or more first part connectors to the one or more second part connectors for testing the device via the one or more second part connectors. The first and the second part are movable with respect to each other via activation of the guide. By moving the first part and the second part relatively with respect to each other, the first part connectors and the second part connectors have been physically disconnected by activation of the guide while the ESD signal is directly delivered to the one or more device terminals, or while the ESD signal is delivered via the first part connectors. By mechanically increasing the distance between the first part connectors and the second part connectors, electrical isolation between the device terminals stressed with an ESD signal and the second part connectors which may be coupled to terminals of a measurement device for testing the device, is improved. In this manner no damage can occur to the measurement device. Further, parasitic capacitances typically found in electronic switches of known ESD testers are avoided or minimized by the increased electrical isolation between the first part connectors and the second part connectors. As a consequence, the ESD signal is not affected by said parasitic capacitances and the ESD test results are more reliable.

Figure 1:
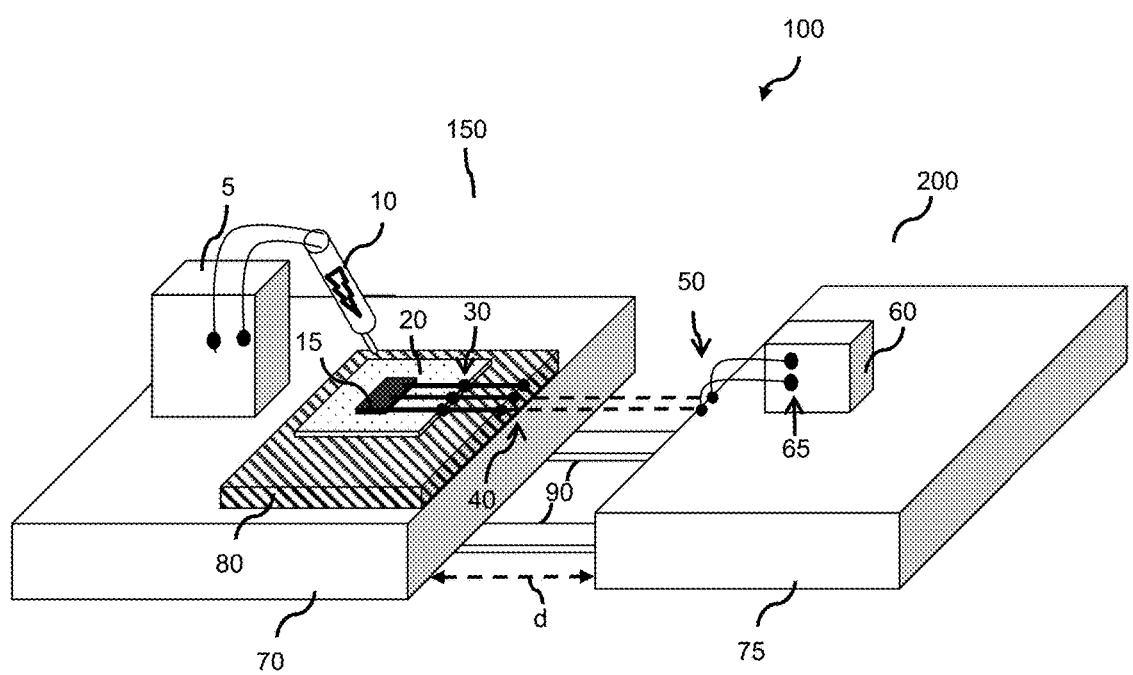
FIG. 1 schematically shows a first example of an apparatus for electrostatic discharge test according to the invention, FIG. 2 schematically shows a second example of an apparatus for electrostatic discharge test according to the invention before an ESD stress, FIG. 3 schematically shows the second example of an apparatus for electrostatic discharge test shown in FIG. 2 but after ESD stress.

FIG. 1 schematically shows a first example of an apparatus 100 for electrostatic discharge (ESD) test according to the invention. The apparatus 100 stresses one or more device terminals 30 of a device 15 by delivering an electrostatic discharge signal to the one or more device terminals 30. The apparatus 100 includes a first part 150 which is configured for mechanically mounting the device 15. The first part 150 includes one or more first part connectors 40 for electrically coupling to the one or more device terminals 30 and providing electrical access to the one or more device terminals 30. The device 15 may be any type of electronic or electrical device under test. For example, the device 15 may be an integrated circuit device mounted on a printed circuit board (PCB) 20. The one or more device terminals 30 may be external pins of the integrated circuit device. The one or more first part connectors 40 may be for example electrical sockets or electrical plugs or electrical pins which are electrically connected to the one or more device terminals 30 via electrical wires, metal lines, for example partially routed on the PCB, or the like.

The PCB 20 may be mechanically movable relative to the first part 150 and second part 200. The PCB 20 may for example be movable on a plane of the first part 150 for placing the device 15 on a desired position.

The apparatus 100 further includes a second part 200. The second part 200 includes one or more second part connectors 50. The second part 200 is configured for electrically coupling the one or more first part connectors 40 to the one or more second part connectors 50 for testing the device via the one or more second part connectors 50.

For example, a measurement device 60 may be electrically coupled to the one or more second part connectors 50 to enable measurements of the device 15 when the second part connectors 50 are electrically coupled to the one or more device terminals 30 via the one or more first part connectors 40.

The measurement device 60 may be any type of measurement device suitable for the specific implementation, for example a current-voltage (I-V) tracker to measure the voltage-current characteristics of each device terminal 30. The measurement device 60 may have one or more measurement terminals 65 electrically coupled to the one or more second part connectors 50 via for example, electrical wires, metal lines or the like.

The first part 150 is movable relative to the second part 200 via one or more guides 90 such that the one or more first part connectors 40 are physically disconnected from the one or more second part connectors 50 while the ESD signal is delivered to the one or more device terminals 30.

For example, the first part 150 and the second part 200 may be movable via one or more sliding tracks 90. The one or more sliding tracks 90 can be mechanically coupled to a corresponding first set of sliding tracks (not shown in FIG. 1) fastened on a first support 70 of the first part 150. The one or more sliding tracks 90 can be mechanically coupled at a second side to a corresponding second set of sliding tracks (not shown in FIG. 1) fastened on a second support 75 of the second part 200. The first set of sliding tracks may be mounted on a side of the first part 150 opposite to the side whereon the device 15 is mounted, for example on a bottom side of the first support 70. Similarly, the second set of sliding tracks may be mounted in the second part 200 on a bottom side of the second support 75.

The ESD signal can be delivered by an electrostatic discharge source 10. The ESD source 10 can be any type of ESD signal generators suitable for the specific implementation, for example an ESD gun electrically connected to an ESD signal simulator 5. A user can adjusts the ESD signal parameters via the ESD simulator 5 (or a user interface thereof) such that the ESD gun can stress the device terminals 30 with a predetermined ESD signal, for example according to the ESD standard to which the device 15 needs to comply.

The ESD simulator 5 may be programmed such that the ESD signal is generated with a predetermined timing pattern to automatize the ESD test, thereby speeding up the ESD test when a large number of device terminals or devices are tested.

By increasing a distance d between the one or more first part connectors 40 and the one or more second part connectors 50 when a ESD signal is delivered to a device terminal, electrical isolation between the measurement device 60 and the device under test 15 increases. Electrical isolation can be increased as desired by moving the first part relative to the second part, thereby increasing the physical distance d between the first part connectors 40 and the second part connectors 50 such that the ESD signal has no detrimental effect on the measurement device 60 while the device 15 is stressed with the ESD signal. The measurement device 60 may be used for testing the device terminal after that the ESD signal has been delivered to the device terminal. Alternatively, the measurement device 60 may be used for testing a neighbouring device terminal of the device terminal which has been delivered with the ESD signal.

The sliding tracks 90 can be activated in any manner specific for the specific implementation.

For example, a user can manually activate the sliding tracks to move the first part 150 or the second part 200 such that the physical distance d is increased as desired while the ESD signal is delivered to the device terminal via the ESD gun 10. After the ESD signal has been delivered, the user can manually move the first part 150 or the second part 200 such that the physical distance d between the first part connectors 40 and the second part connectors 50 has decreased such that the first part connectors 40 make physical and electrical contact with the second part connectors 50.

In another example according to an embodiment of the invention, the apparatus may include a motorized stage, for example electrically or hydraulically or piezo-electrically or electro-pneumatically driven, configured for activating the sliding tracks 90 and moving the first part 150 or the second part 200 with respect to each other. For example, a motorized stage may be arranged to drive the one or more sliding tracks 90 along the corresponding first set of sliding tracks (not shown FIG. 1) of the first part 150 or along the corresponding second set of sliding tracks (not shown FIG. 1) of the second part 250 to move forward and/or back the first part 150 relative to the second part 200.

The apparatus 100 may further include an electrically insulating plane or layer 80. The support 70 of the first part 150 and the support 75 of the second part 200 may be electrically connected to the ground. The electrically insulating layer 80 can be arranged between the device 15 and the ground plane for isolating the device 15 from the ground plane. In this example, the device 15 is mounted on the PCB 20 which is isolated from the ground by the electrically insulating layer 80.

Figure 2:
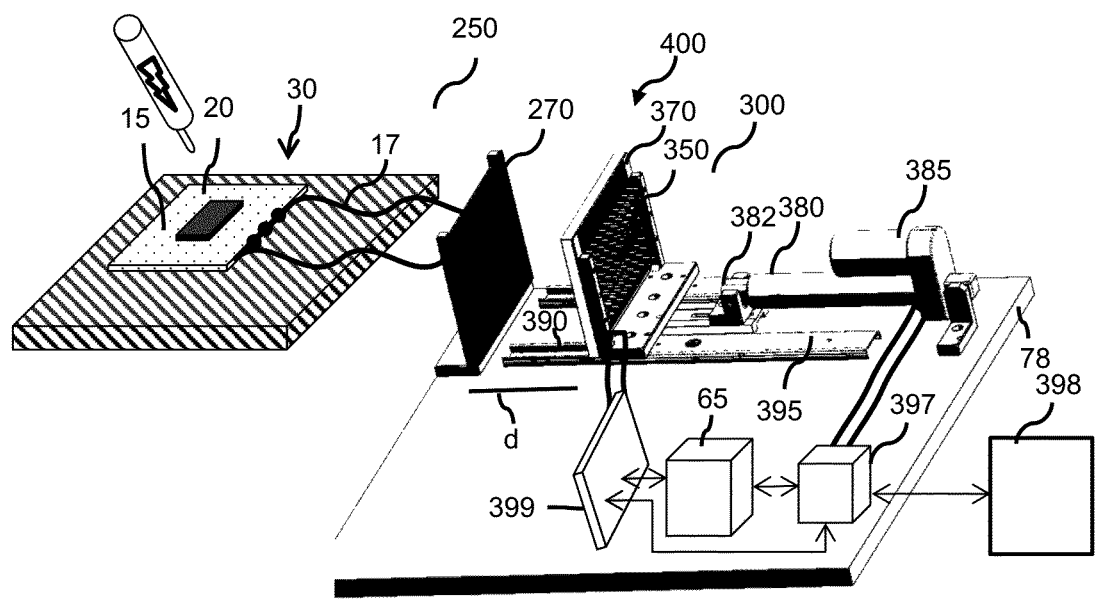

FIG. 2 schematically shows a second example of an apparatus 400 for electrostatic discharge test according to another embodiment of the invention.

Figure 3:
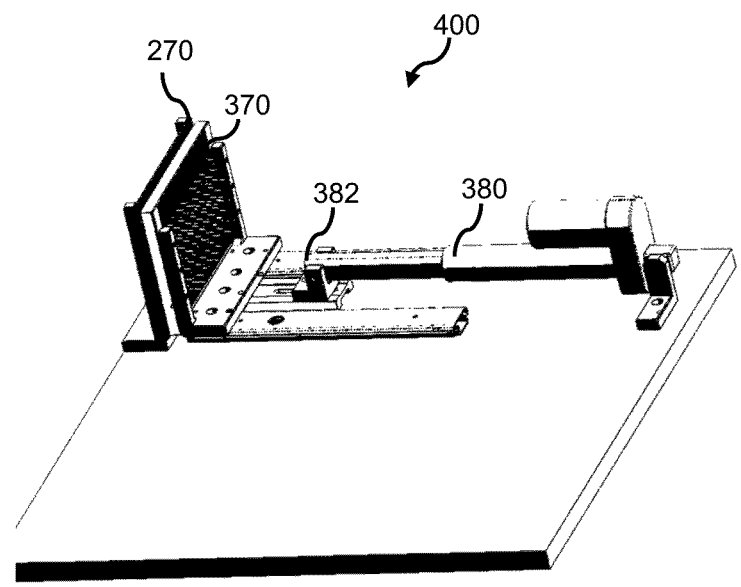

FIG. 3 shows the same apparatus 400 but in use after the ESD signal has been delivered to the device 15.

The apparatus 400 includes a first part 250 fastened to a support 78 and a second part 300. The second part 300 includes an electrically motorized stage which provides activation of a guide including a first pair of sliding tracks 390 and a second pair of sliding tracks 395 such that the second part 350 can move relative to the first part 250. The first part 250 includes a first printed circuit board (PCB) 270 which is in this example vertically mounted. The first printed circuit board 270 can include on both sides socket terminals which can electrically connect to second part connectors 350 on one side and to the device terminals 30 on the other side via for example electrical wires 17. The first part 250 further includes the PCB 20 for mounting the device 15 and the electrically insulating layer 80 for isolating the device 15 from the ground. The second part 300 includes a second printed circuit board (PCB) 370 which is also in this example vertically mounted. The second PCB 370 can include the one or more second part connectors 350, for example pin terminals which can plug or unplug the socket terminals of the first PCB 270. The second part 300 further includes an electrically motorized cylinder 380, the first pair of sliding tracks 390 fastened on the support 78, and the second pair of sliding tracks 395 mechanically coupling the first pair of sliding tracks 390. The second pair of sliding tracks can be controlled to slide along the first pair of sliding tracks 390. The second pair of sliding tracks 395 can be controlled to slide along the first pair of sliding tracks 390 forward and back.

The electrically motorized cylinder 380 has a first end fastened on the support 78 and a second end 382 opposite to the first end which is extendable and fixed to the second pair of sliding tracks 395. The second PCB 370 is mechanically mounted on the second pair of sliding tracks 395 such that the second PCB 370 can be controlled to move towards the first PCB 270 to contact the first part connectors of the first PCB 270 when the device 15 is tested after an ESD stress. The second PCB 370 can be controlled to move away from the first PCB 270 while the device 15 is under ESD stress to increase the electrical isolation between the first part connectors and the second part connectors 350.

The electrically motorized cylinder can be controlled by a controller 397. The electrically motorized cylinder may be driven by an electric motor 385 controlled by the controller 390. The controller 397 may control a relative position of the second part 300 relative to the first part 250 for example to obtain the desired electrical isolation d while the device 15 is delivered with an ESD signal. The controller 390 may control a relative position of the second part 300 with respect to the first part 250 such to provide an electrical connection between the first PCB 270 and the second PCB 370 for testing the device terminals 30 after the ESD stress. FIG. 3 shows the apparatus 400 after an ESD signal has been applied to a device terminal. In FIG. 3, the first PCB 270 and the second PCB 370 are in physical and electrical contact between each other. The second end 382 of the cylinder 380 is controlled to extend until the first second PCB 370 contacts the second PCB 270.

Referring back to FIG. 2, the apparatus may further include a user interface 398 for programming the controller 397. The user interface 398 can be communicatively connected to the controller 397 by for example electrical wires or wirelessly with an appropriate wireless communication device (Bluetooth, Wifi, or the like). The user interface 398 can for example show conditions of test, measurement results, device information or device terminal information. A user may configure the controller 397 via the user the interface 398 such that ESD testing with the apparatus 400 is automatized. The user interface 398 may include a display (not shown in FIG. 2) for displaying the information, and integrated in a computing device such as a personal computer further including a processor (not shown in FIG. 2) for processing the information, and a memory (not shown in FIG. 2) for storing the information. The user interface 398 may include a peripheral (not shown in FIG. 2) via which the user can configure the processor, the memory of the computing device and the controller 397. The peripheral can be any type of peripherals suitable for the specific implementation, for example a keyboard, a mouse or the like. Alternatively, the display of the user interface 398 can integrate a touchscreen function via which a user can control the controller 397 or the other parts of the apparatus 400 or user interface 398.

The ESD signal may be delivered by the same ESD source shown with reference to FIG. 1, for example an ESD gun.

By using an electrically-motorized stage, ESD testing can be automatized so that a predetermined and accurate distance d can be selected depending on the applied ESD signal. Further, since the electrically-motorized stage can be controlled with greater precision than when the guide is manually activated for moving the second part relative to the first part, ESD tests are more reproducible and thus more reliable.

The apparatus 400 can further include a measurement device 65 and a relay matrix 399. The measurement device 65 may be electrically coupled via one or more measurement terminals and via the relay matrix 399 to the one or more second part connectors 350 The relay matrix 399 can include a plurality of relay switches which are electrically connected to the second part connectors 350. When the electrically motorized cylinder 380 extends such that the terminals of the second PCB 370 make electrically contacts with the terminals of the first PCB 270, as shown in FIG. 3, the relay matrix 399 can be controlled, for example by the controller 397, to directly electrically couple a particular device terminal to the measurement terminals of the measurement device 65, thereby selecting the particular device terminal to be measured.

The device terminals 30 are tested one by one after that the ESD signal has been delivered to the device 15. By using the relay matrix 399, testing of the device terminals 30 is further automatized because there is no need to manually connecting each time the measurement terminals to each second part connector corresponding to the particular device terminal to be measured.

In an embodiment, the apparatuses 100 or 400 may further include a third part configured for mounting the ESD source. The third part may be movable relative to the first part and the second part. The third part may be moved such that an ESD signal may be delivered to a desired device terminal or corresponding first part connector. The third part may be provided with an electric motor to drive a position of the ESD source to the targeted device terminal or first part connector. The third part of the apparatus may be controlled by the controller 397 and synchronized with the electrically motorized stage such that an ESD signal is automatically delivered to a device terminal when the electrically motorized stage is controlled to move the first part and the second part away from each other at the desired distance.

By using a third part movable relatively to the first part and the second part, ESD testing can be completely automatized and programmed according to the type of device tested, position of the device terminals, and electrically isolation required.

In an embodiment, the one or more device terminals can be selectively electrically connected either to the one or more first part connectors or to the ESD source. The one or more device terminals can be electrically connected to the one or more first part connectors when the one or more first part connectors are physically disconnected from the one or more second part connectors. The one or more device terminals can be electrically connected to the ESD source when the one or more first part connectors are physically connected to the one or more second part connectors.

In an embodiment, the one or more device terminals can be selectively electrically connected either to the one or more first part connectors or to the ESD source automatically in synchronization with activation of the guide. In this case when the guide has been activated for physically disconnecting the one or more first part connectors from the one or more second part connectors, the one or more device terminals can be automatically electrically connected to the ESD source.

By selectively connecting the one or more device terminals to either the one or more first part connectors or the ESD source by for example a relay switch, ESD testing can also be completely automatized.

Figure 4:
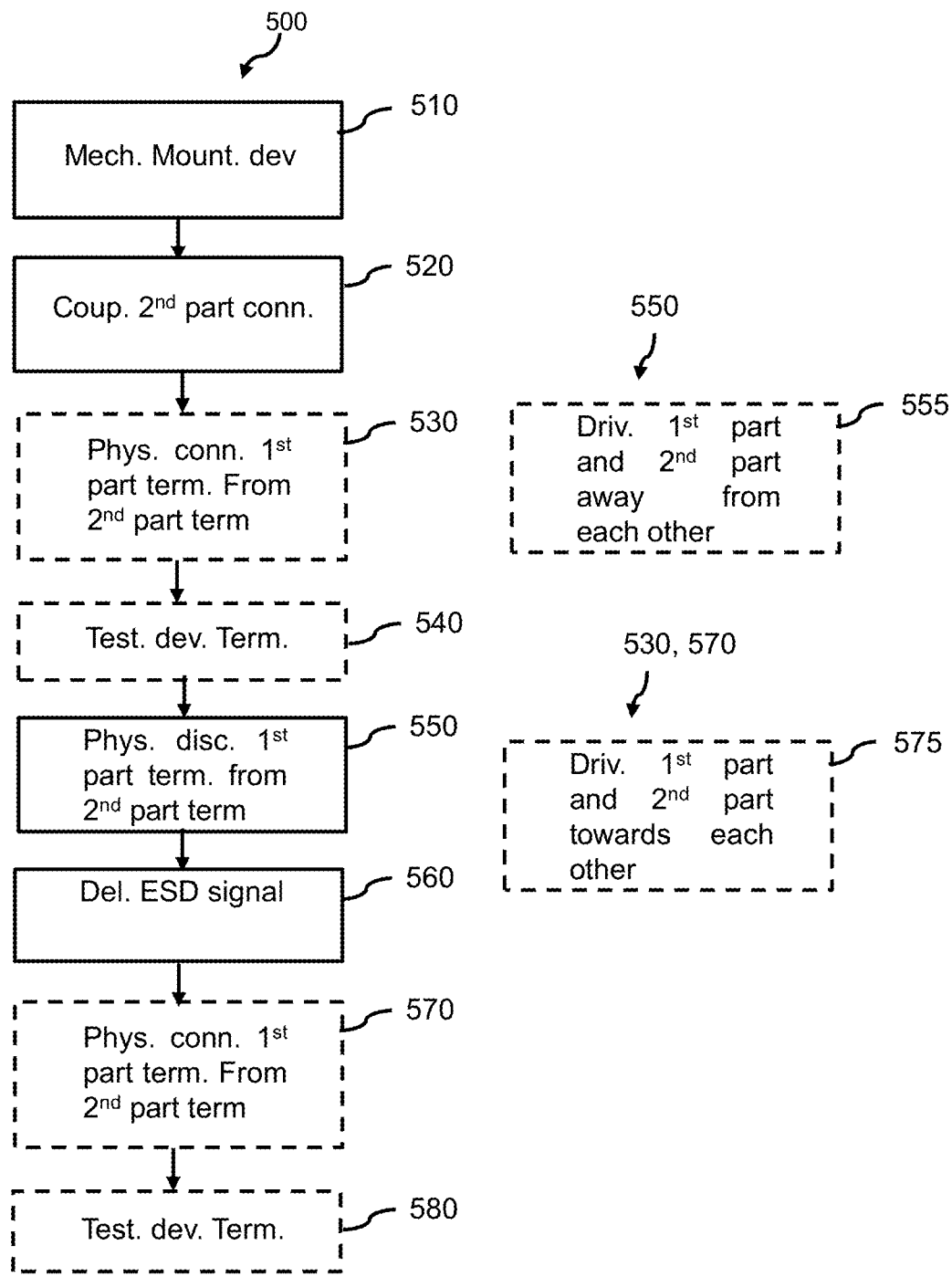
FIG. 4 shows a flow diagram of a method of stressing one or more device terminals of a device with an electrostatic discharge signal.

FIG. 4 shows a flow diagram of a method 500 of stressing one or more device terminals of a device with an electrostatic discharge signal.

The method includes mechanically mounting 510 the device on a first part of the apparatus 100 or 400 for providing electrical access to the one or more device terminals via one or more first part connectors. The one or more first part connectors provide electrical access to the one or more device terminals by electrically coupling the one or more device terminals. The method includes electrically coupling 520 the one or more first part connectors to the one or more second part connectors for testing the device via the one or more second part connectors, mechanically moving 550 the first part relative to the second part via activation of a guide for physically disconnecting the one or more first part connectors from the one or more second part connectors, and delivering 560 the electrostatic discharge signal to the one or more device terminals.

Mechanically moving 550 the first part relative to the second part via activation of the guide for physically disconnecting the one or more first part connectors from the one or more second part connectors can include driving 555, e.g. electrically or hydraulically or piezo-electrically or electropneumatically, the guide such that the first part is moved away relative to the second part to obtain a physical disconnection between the respective first part connectors and second part connectors.

The method 500 may further include before physically disconnecting 550 the one or more first part connectors from the one or more second part connectors, physically connecting 530 the one or more first part connectors to the one or more second part connectors via activation of the guide and testing 540 the one or more device terminals via the connected second part connectors. The second part connectors may be for example coupled to a measurement device for testing the device terminals before an ESD signal is delivered to the device, i.e. to test the device terminals at nominal conditions. While testing the device with the measurement device, a power supply may be connected to the device.

The method includes after physically disconnecting 550 the one or more first part connectors from the one or more second part connectors, delivering 560 the ESD signal to the one or more device terminals. While the ESD is delivered to a device terminal, the first part connectors have been electrically isolated from the second part connectors via activation of the guide. When delivering the ESD signal, the power supply device may be disconnected form the device.

The method 500 may further include after delivering 560 the ESD signal, physically connecting 570 the one or more first part connectors to the one or more second part connectors via activation of the guide for testing the device via the one or more second part connectors. For example, a measurement device 60 or 65 may be used as described with reference to FIG. 1 and FIG. 2 which is electrically coupled to the second part connectors via respective measurement terminals of the measurement device.

Physically connecting 530, 570 the one or more first part connectors to the one or more second part connectors via activation of the guide can include driving 575, e.g. electrically or hydraulically or piezo-electrically or electropneumatically, the guide such that the first part and the second part move towards each other to obtain a physical connection between the respective first part connectors and second part connectors.

The method 500 may additional include testing 580 the one or more device terminals after that the one or more first part connectors are physically connected 580 to the one or more second part connectors. Measurements performed after ESD stress can be compared to measurement performed before the ESD stress to evaluate for example whether a damage has occurred to the device or not.

The method can be performed with the apparatus 100 or 400 described with reference to FIG. 1, FIG. 2 and FIG. 3.

It is to be understood that the architectures depicted herein are merely exemplary, and that in fact many other architectures can be implemented which achieve the same functionality.

For example, in the FIG. 1 and FIG. 2 the apparatus 100 or 400 includes measurement device 60 or 65. However, the measurement device 60 or 65 may be not included in the apparatus 100 or 400, but located elsewhere and connected to the second part connectors via respective measurement terminals. Similarly, with reference to FIG. 1, the apparatus 100 includes the ESD simulator 5 and the ESD gun 10 which can be located elsewhere.

In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably electrically coupled," to each other to achieve the desired functionality.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Furthermore, the devices may be physically distributed over a number of apparatuses, while functionally operating as a single device. Also, devices functionally forming separate devices may be integrated in a single physical device. Also, the units and circuits may be suitably combined in one or more semiconductor devices. However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. Apparatus for testing a device by delivering an electrostatic discharge signal to one or more device terminals of the device, the apparatus comprising:
    a first part configured for mechanically mounting the device and comprising one or more first part connectors for electrically coupling to the one or more device terminals for providing electrical access to the one or more device terminals;
    a second part comprising one or more second part connectors, the second part configured for electrically coupling the one or more first part connectors to the one or more second part connectors for testing the device via the one or more second part connectors;
    a guide configured for mechanically moving the first part relative to the second part, wherein the guide is configured to physically disconnect the one or more first part connectors from the one or more second part connectors while the electrostatic discharge signal is delivered to the one or more device terminals.

2. Apparatus according to claim 1, further comprising a motorized stage configured for activating the guide to perform the physical disconnection.

3. Apparatus according to claim 2, wherein one of the first part and the second part comprises the motorized stage.

4. Apparatus according to claim 1, further comprising a controller configured to control activation of the guide to perform the physical disconnection.

5. Apparatus according to claim 4, wherein the controller is configured for controlling activation of the guide for physically disconnecting the one or more first part connectors from the one or more second part connectors before delivering the electrostatic discharge signal to the one or more device terminals.

6. Apparatus according to claim 4, wherein the controller is configured for controlling activation of the guide for physically connecting the one or more first part connectors to the one or more second part connectors after delivering the electrostatic discharge source to the one or more device terminals for testing the device.

7. Apparatus according to claim 4, further comprising a user interface for programming the controller.

8. Apparatus according to claim 1, further comprising an electrostatic discharge source configured to deliver the electrostatic discharge signal to the one or more device terminals.

9. Apparatus according to claim 8, further comprising a third part configured for mounting the electrostatic discharge source, wherein the third part is movable relative to the first part and the second part.

10. Apparatus according to claim 1, wherein the electrostatic discharge source comprises an electrostatic discharge gun.

11. Apparatus according to claim 1, further comprising:
    an electrically insulating plane; and
    a ground plane, wherein the electrically insulating plane is arranged between the device and the ground plane, and is configured for isolating the device from the ground plane.

12. Apparatus according to claim 1, further comprising a measurement device comprising one or more measurement terminals electrically coupled to the one or more second part connectors for testing the device.

13. Apparatus according to claim 12, further comprising a relay matrix configured for electrically coupling the one or more second part connectors to the one or more measurement terminals for electrically connecting a particular one of the one or more device terminals to the one or more measurement terminals for testing the particular device terminal.

14. Apparatus according to claim 1, further comprising a printed circuit board arranged on the first part and configured for mechanically mounting the device, wherein the printed circuit board is mechanically movable relative to the first part for delivering the electrostatic discharge signal to the one or more device terminals.

15. Apparatus according to claim 1, wherein the second part comprises:
    an electrically motorized cylinder; and
    a printed circuit board comprising the one or more second part connectors, wherein
        the guide comprises a first set of one or more sliding tracks fastened on a fixed support and a second set of one or more sliding tracks configured for mechanically coupling to the first set,
        the electrically motorized cylinder and the printed circuit board are arranged to be mechanically mounted to the second set of the one or more sliding tracks, and
        the electrically motorized cylinder is configured to activate motion of the second set of one or more sliding tracks relative to the first set.

16. A method of testing a device by delivering an electrostatic discharge signal to one or more device terminals, the method comprising:
    mechanically mounting the device on a first part for providing electrical access to the one or more device terminals via one or more first part connectors of the first part for electrically coupling the one or more device terminals;
    electrically coupling the one or more first part connectors to one or more second part connectors for testing the device via the one or more second part connectors;
    mechanically moving the first part relative to the second part via activation of a guide for physically disconnecting the one or more first part connectors from the one or more second part connectors;
    delivering the electrostatic discharge signal to the one or more device terminals after the guide has been activated.

17. A method according to claim 16, wherein mechanically moving the first part relative to the second part comprises driving the guide.

18. A method according to claim 16, comprising, after delivering the electrostatic discharge signal to the one or more device terminals, physically connecting the one or more first part connectors to the one or more second part connectors via activation of the guide.

19. A method according to claim 18, wherein physically connecting the one or more first part connectors to the one or more second part connectors via activation of the guide comprises driving the first part towards the second part.

20. A method according to claim 18, comprising after physically connecting the one or more first part connectors to the one or more second part connectors via activation of the guide, testing the one or more device terminals via the one or more second part connectors.

* * * * *